(12) United States Patent
Wu et al.

(10) Patent No.: US 12,733,098 B1
(45) Date of Patent: Sep. 8, 2026

(54) CIRCUIT BOARD AND FABRICATION METHOD THEREOF, AND ELECTRONIC DEVICE

(71) Applicant: WUS PRINTED CIRCUIT (KUNSHAN) CO., LTD., Suzhou (CN)

(72) Inventors: Chuan Pin Wu, Suzhou (CN); Shuai Zhao, Suzhou (CN); Bin Nie, Suzhou (CN); Zhi Bian, Suzhou (CN); Guitao Zhan, Suzhou (CN); Zhigang Yang, Suzhou (CN); Lianxiang Zhao, Suzhou (CN)

(73) Assignee: WUS PRINTED CIRCUIT (KUNSHAN) CO., LTD., Suzhou (CN)

( * ) Notice: Subject to any disclaimer, the term of this patent is extended or adjusted under 35 U.S.C. 154(b) by 0 days.

(21) Appl. No.: 19/650,303

(22) Filed: Apr. 16, 2026

Related U.S. Application Data

(63) Continuation of application No. PCT/CN2025/132297, filed on Nov. 4, 2025.

(30) Foreign Application Priority Data

Oct. 27, 2025 (CN) ......................... 202511536936.0

(51) Int. Cl.
*H05K 1/14* (2006.01)
*H05K 1/03* (2006.01)

(52) U.S. Cl.
CPC ........... *H05K 1/142* (2013.01); *H05K 1/0366* (2013.01)

(58) Field of Classification Search
CPC ............................. H05K 1/142; H05K 1/0366
USPC ......................................................... 361/784
See application file for complete search history.

(56) References Cited

U.S. PATENT DOCUMENTS 6,281,446 B1 * 8/2001 Sakamoto .............. H05K 1/142 257/E23.172
11,164,818 B2 * 11/2021 Pietambaram ........ H10W 20/20
11,751,335 B2 * 9/2023 Yoo ........................ H05K 1/112 361/761

(Continued)

FOREIGN PATENT DOCUMENTS

CN 103327756 A 9/2013
CN 109618509 A 4/2019

(Continued)

OTHER PUBLICATIONS

Clyde F. Coombs Jr, "Printed Circuit Handbook—Design and Manufacturing", Dec. 31, 2018.

(Continued)

*Primary Examiner* — Binh B Tran
(74) *Attorney, Agent, or Firm* — Fideli Law; Qiang Li

(57) ABSTRACT

This application discloses a circuit board and a fabrication method thereof, and an electronic device. The circuit board includes: a main board; a daughter board disposed in a blind cavity of the main board; and a build-up board, disposed on surfaces of the main board and the daughter board. The build-up board includes a build-up structure containing a plurality of layers. The build-up board is provided with a first chip region, a second chip region, and an interconnection region located between the first chip region and the second chip region. The interconnection region covers a surface of the daughter board. A plurality of interconnection traces are provided in the interconnection region.

30 Claims, 3 Drawing Sheets

(56) References Cited

U.S. PATENT DOCUMENTS

| | | | | |
|---|---|---|---|---|
| 2011/0180306 | A1 | 7/2011 | Naganuma et al. | |
| 2016/0302308 | A1* | 10/2016 | Lee | H05K 3/4694 |

FOREIGN PATENT DOCUMENTS

| | | | |
|---|---|---|---|
| CN | 218006601 | U | 12/2022 |
| CN | 115881546 | A | 3/2023 |
| CN | 116847550 | A | 10/2023 |
| CN | 118450635 | A | 8/2024 |
| CN | 120417230 | A | 8/2025 |
| JP | 201166372 | A | 3/2011 |
| TW | 201143568 | A | 12/2011 |
| TW | 201212746 | A | 3/2012 |
| WO | 2012031517 | A1 | 3/2012 |
| WO | 2024198726 | A1 | 10/2024 |

OTHER PUBLICATIONS

The First Office Action for China Application No. 202511536936.0, Nov. 28, 2025.

The Rejection Decision for China Application No. 202511536936.0, Feb. 2, 2026.

The First Office Action for Taiwan Application No. 114149075, Jan. 14, 2026.

The Rejection Decision for Taiwan Application No. 114149075, Mar. 30, 2026.

International Search Report & Written Opinion in PCT/CN2025/132297 mailed on Mar. 31, 2026, 16 pages.

* cited by examiner

CIRCUIT BOARD AND FABRICATION METHOD THEREOF, AND ELECTRONIC DEVICE

RELATED APPLICATIONS

The present patent document is a continuation of PCT/CN2025/132297, filed Nov. 4, 2025, which claims the benefit of priority to Chinese Patent Application No. 202511536936.0, filed Oct. 27, 2025, and entitled "CIRCUIT BOARD AND FABRICATION METHOD THEREOF, AND ELECTRONIC DEVICE" the entire contents of each of which are incorporated herein by reference.

TECHNICAL FIELD

This application relates to the technical field of printed circuit board fabrication, and in particular, to a circuit board and a fabrication method thereof, and an electronic device.

BACKGROUND

With the continuous increase in the data transmission rate, a unit area needs to be populated with an increasing number of components, resulting in increasingly smaller design clearances and finer traces in a printed circuit board (PCB). When a plurality of components are integrated on a PCB, electrical conduction and signal transmission between different components are typically implemented through internal routing of the PCB. However, with the increase in PCB integration density, more and more chips may need to be connected, placing higher requirements on the routing density of PCBs. An excessively high routing density makes it difficult to meet the requirements on trace width and trace spacing, leading to increased signal interference between traces. Further, in the case of interconnecting chips over long distances, traces need to bypass specified regions to avoid signal interference, thereby increasing routing difficulty.

SUMMARY

An objective of this application is to provide a circuit board and a fabrication method thereof, and an electronic device to overcome the difficulty of interconnection between components on a PCB in the related art.

To achieve the above objective, this application puts forward the following technical solutions:

According to a first aspect, this application provides a circuit board, including:

- a main board, where the main board is provided with a blind cavity;
- a daughter board, where the daughter board is disposed in the blind cavity, and a daughter board trace is provided in the daughter board; and
- a build-up board, where the build-up board is disposed on surfaces of the main board and the daughter board; the build-up board includes a build-up structure containing a plurality of layers; the build-up board is provided with a first chip region, a second chip region, and an interconnection region located between the first chip region and the second chip region; and the interconnection region covers a surface of the daughter board.

A plurality of interconnection traces are provided in the interconnection region. Each interconnection trace includes: a first horizontal trace and a second horizontal trace disposed on the same layer of the build-up structure, a first vertical trace disposed in the build-up board and configured to connect the first horizontal trace and the daughter board trace, and a second vertical trace disposed in the build-up board and configured to connect the second horizontal trace and the daughter board trace. A first trace configured to connect the first horizontal trace and a first chip is provided in the first chip region, and a second trace configured to connect the second horizontal trace and a second chip is provided in the second chip region.

Optionally, the daughter board trace is a U-shaped structure. The daughter board trace is connected to the first vertical trace by a first pad, and is connected to the second vertical trace by a second pad.

The first pad and the second pad are located on a surface of the daughter board on a side close to the build-up board.

Optionally, the first chip is located on a surface of the first chip region, and the second chip is located on a surface of the second chip region.

Optionally, the first chip region is provided with a third trace configured to connect the first chip and the main board. The second chip region is provided with a fourth trace configured to connect the second chip and the main board.

Optionally, the build-up structure includes prepreg and copper foil stacked sequentially.

Optionally, a space between the daughter board and the main board is filled with a dielectric layer.

Optionally, the dielectric layer is a resin material layer.

Optionally, a plurality of interconnection traces are nested in layers across a plurality of layers of the build-up structure.

According to a second aspect, this application provides a method for fabricating the circuit board disclosed in the first aspect. The method includes:

- forming the blind cavity on the main board;
- disposing, in the blind cavity, the daughter board containing the daughter board trace; and
- performing a plurality of build-up processes on a surface of the main board to form the build-up board; performing stacked-via drilling and electroplating on the build-up structure after each build-up process to form a first vertical trace and a second vertical trace; and creating traces for the build-up structure after each build-up process to form a first trace, a second trace, a first horizontal trace, and a second horizontal trace, where the first trace, the first horizontal trace, the first vertical trace, the daughter board trace, the second vertical trace, the second horizontal trace, and the second trace are connected sequentially.

Optionally, the "performing a plurality of build-up processes on a surface of the main board to form the build-up board; performing stacked-via drilling and electroplating on the build-up structure after each build-up process to form a first vertical trace and a second vertical trace; and creating traces for the build-up structure after each build-up process to form a first trace, a second trace, a first horizontal trace, and a second horizontal trace, where the first trace, the first horizontal trace, the first vertical trace, the daughter board trace, the second vertical trace, the second horizontal trace, and the second trace are connected sequentially" includes:

- laser-drilling current-layer vias and stacked vias in the build-up structure resulting from the first build-up process and in the dielectric layer; laser-drilling, on an outermost layer of the build-up structure after each subsequent build-up process, current-layer vias and stacked vias that are stacked with the stacked vias on an adjacent layer of the build-up structure, where the current-layer vias are at least one pair of vias located at an outermost side in a cavity width direction of the blind cavity among the laser-drilled vias on each layer;

electroplating and filling the current-layer vias and the stacked vias in the outermost layer of the build-up structure after each build-up process, such that the current-layer vias and the stacked vias stacked with the current-layer vias form a first vertical trace and a second vertical trace after being electroplated; and fabricating a first trace, a second trace, a first horizontal trace, a second horizontal trace, a third trace, and a fourth trace in the outermost layer of the build-up structure after each build-up process, where the first trace, the first horizontal trace, and the first vertical trace are connected sequentially, and the second trace, the second horizontal trace, and the second vertical trace are connected sequentially.

According to a third aspect, this application provides an electronic device. The electronic device includes the circuit board disclosed in the first aspect, or a circuit board fabricated using the method disclosed in the second aspect.

Compared with the prior art, this application achieves at least the following beneficial effects: this application embeds a daughter board in a main board, and disposes a build-up board on the main board. The build-up board includes a build-up structure containing a plurality of layers. The first chip and the second chip are disposed on the build-up board, and are interconnected through the first trace, the first horizontal trace, the first vertical trace, the daughter board trace, the second vertical trace, the second horizontal trace, and the second trace that are connected sequentially. The first horizontal trace and the second horizontal trace are disposed in the same layer of the build-up structure, thereby enabling the layered layout of a plurality of interconnection traces. Further, long-distance interconnection between the first chip and the second chip is implemented through the first horizontal trace and the second horizontal trace. In addition, this application forms a relatively large longitudinal space through the daughter board and the build-up board, and utilizes the longitudinal space to vertically arrange the first vertical trace and the second vertical trace to disperse the routing density and avoid signal interference between traces.

BRIEF DESCRIPTION OF DRAWINGS

In order to describe the technical solutions in embodiments of this application or in the related art more clearly, the accompanying drawings for describing the embodiments or the related art are briefly described below. Apparently, the accompanying drawings in the following description are merely some embodiments of this application, and those of ordinary skill in the art may still derive other accompanying drawings from these accompanying drawings without making any creative efforts.

List of reference signs: 1-main board; 2-daughter board; 3-build-up board; 4-interconnection trace; 5-dielectric layer; 6-first chip; 7-second chip; 11-blind cavity; 21-daughter board trace; 22-first pad; 23-second pad; 31-first chip region; 32-second chip region; 33-interconnection region; 41-first horizontal trace; 42 second horizontal trace; 43-first vertical trace; 44-second vertical trace.

DETAILED DESCRIPTION

The following describes the technical solutions in some embodiments of this application clearly and comprehensively with reference to the drawings appended hereto. Evidently, the described embodiments are merely a part of but not all of the embodiments of this application. The following description of at least one exemplary embodiment is merely illustrative, and is in no way intended as a limitation on this application or the use thereof.

Embodiment 1

Figure 1:
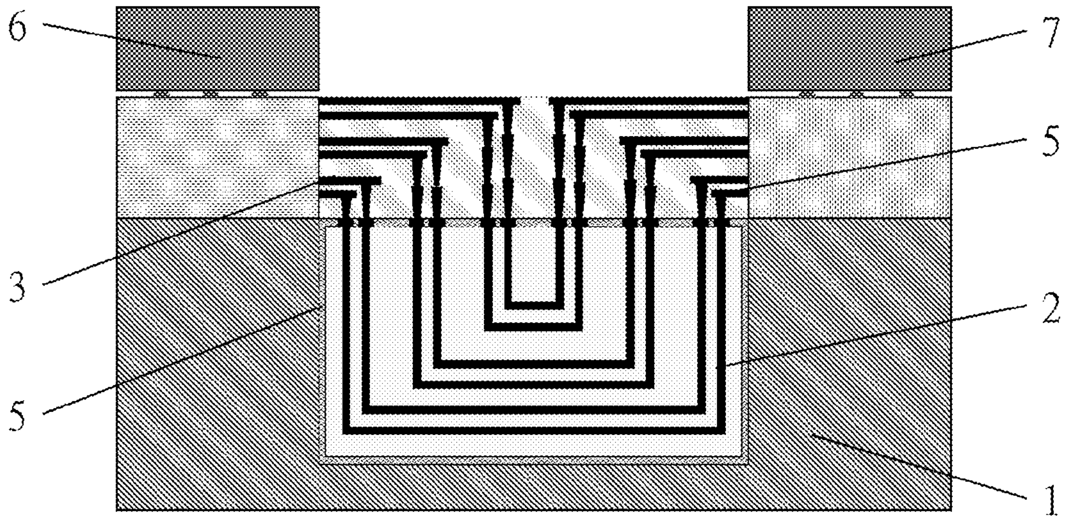
FIG. 1 is a schematic diagram of an overall structure according to Embodiment 1 or 2 of this application.
Figure 2:
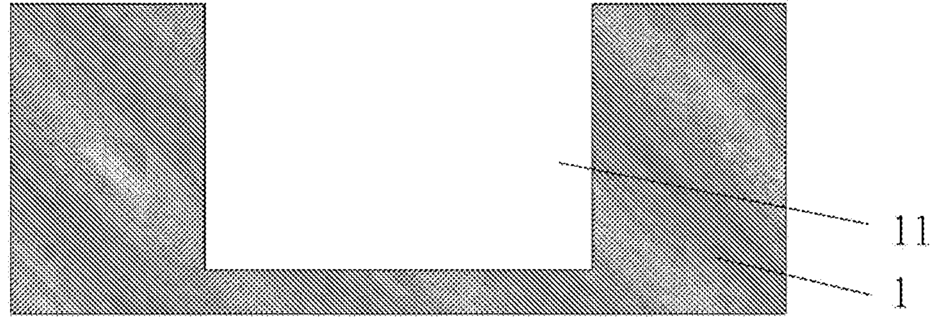
FIG. 2 is a schematic structural diagram of a main board according to Embodiment 1 or 2 of this application.
Figure 3:
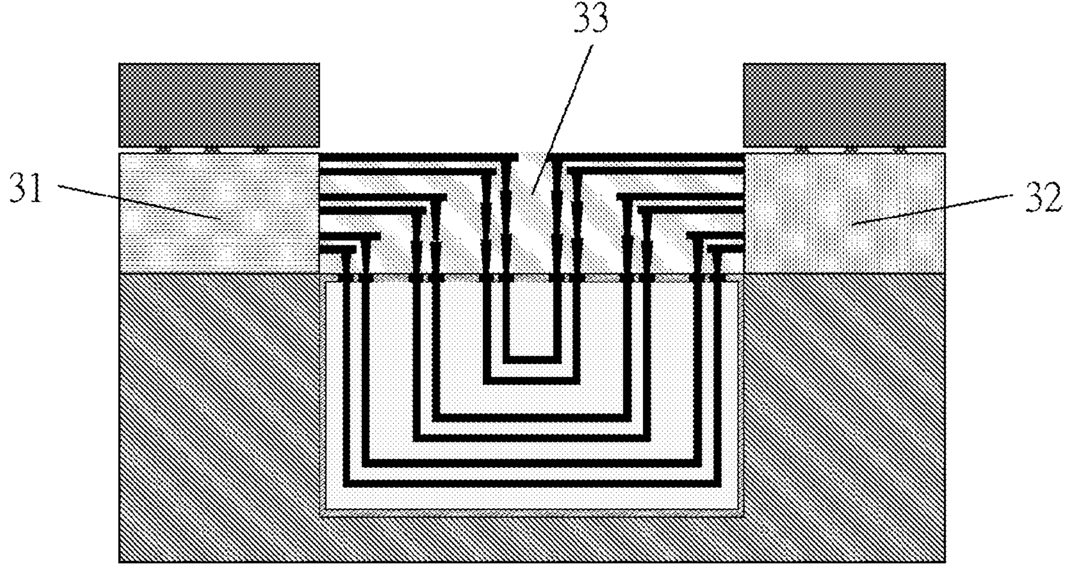
FIG. 3 is a schematic structural diagram of a build-up board according to Embodiment 1 or 2 of this application.

This embodiment describes a circuit board. Referring to FIG. 1 and FIG. 2, this embodiment provides a circuit board, including: a main board 1, where the main board 1 is an A-board or an A+B board with pre-fabricated circuitry. The main board 1 is configured to connect chips that need to be interconnected. A blind cavity 11 is provided on the main board 1. A daughter board 2 is provided in the blind cavity 11. The daughter board 2 is a multilayer board with pre-fabricated circuitry, and a daughter board trace 21 is provided in the daughter board. A build-up board 3 is provided on surfaces of the main board 1 and the daughter board 2. Referring to FIG. 3, the build-up board 3 includes a build-up structure containing a plurality of layers. The build-up board 3 is provided with a first chip region 31, a second chip region 32, and an interconnection region 33 located between the first chip region 31 and the second chip region 32.

Figure 4:
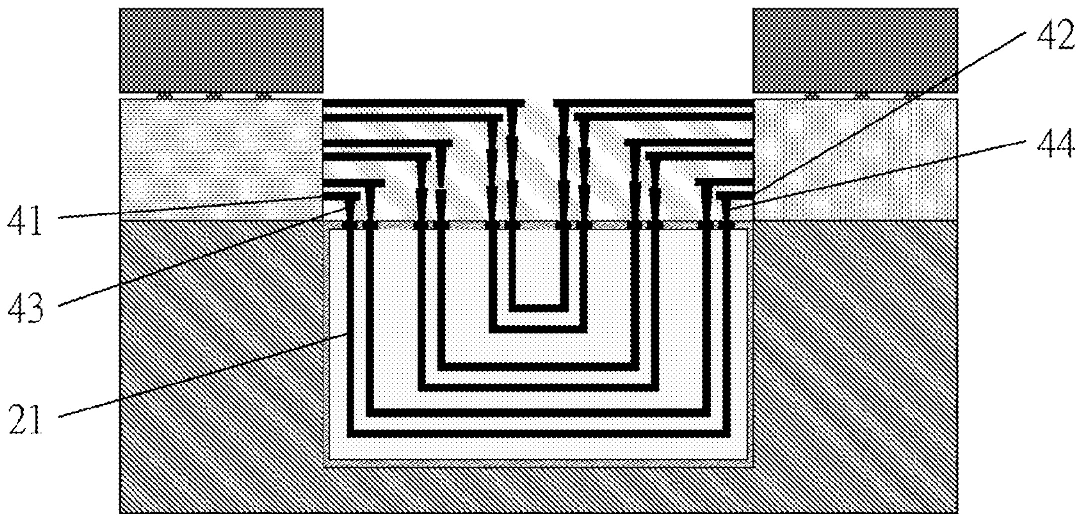
FIG. 4 is a schematic layout of interconnection traces according to Embodiment 1 or 2 of this application.

Referring to FIG. 4, the interconnection region 33 covers the surface of the daughter board 2. A plurality of interconnection traces 4 are disposed in the interconnection region. The number of interconnection traces 4 may be set based on the number of connection points of the chips to be interconnected. Each interconnection trace 4 includes: a first horizontal trace 41 and a second horizontal trace 42 disposed on the same layer of the build-up structure, a first vertical trace 43 disposed in the build-up board 3 and configured to connect the first horizontal trace 41 and the daughter board trace 21, and a second vertical trace 44 disposed in the build-up board 3 and configured to connect the second horizontal trace 42 and the daughter board trace 21. Further, a first trace configured to connect the first horizontal trace 41 and a first chip 6 is provided in the first chip region 31. A second trace configured to connect the second horizontal trace 42 and the second chip 7 is provided in the second chip region 32. Specifically, when the first chip 6 and the second chip 7 are connected to the main board 1, the first trace and the second trace can be correspondingly connected to the interconnection points (for example, solder balls) of the first chip 6 and the second chip 7.

In this embodiment, the daughter board 2 is embedded in the main board 1, and the build-up board 3 is disposed on the main board 1. The build-up board 3 includes a build-up structure containing a plurality of layers. The first chip 6 and the second chip 7 are disposed on the build-up board 3, and are interconnected through the first trace, the first horizontal trace 41, the first vertical trace 43, the daughter board trace 21, the second vertical trace 44, the second horizontal trace 42, and the second trace that are connected sequentially. The first horizontal trace 41 and the second horizontal trace 42 are disposed in the same layer of the build-up structure, thereby enabling the layered layout of a plurality of interconnection traces 4. Further, long-distance interconnection between the first chip 6 and the second chip 7 is implemented through the first horizontal trace 41 and the second horizontal trace 42. In addition, this application forms a relatively large longitudinal space through the daughter board 2 and the build-up board 3, and utilizes the longitudinal space to vertically arrange the first vertical trace 43 and the second vertical trace 44 to disperse the routing density and avoid signal interference between traces.

Embodiment 2

Based on the same inventive concept as Embodiment 1, referring to FIG. 1, in this embodiment, the first chip region 31 is provided with a third trace configured to connect the first chip 6 and the main board 1. The second chip region 32 is provided with a fourth trace configured to connect the second chip 7 and the main board 1. When mounted on the build-up board 3, the first chip 6 and the second chip 7 can be connected to the main board 1 through the third trace and the fourth trace respectively. Further, when the first chip 6 is connected to the main board 1 by the third trace, the connection point on the first chip can be connected to the first trace. When the second chip 7 is connected to the main board 1 by the fourth trace, the connection point on the second chip can be connected to the second trace.

Figure 5:
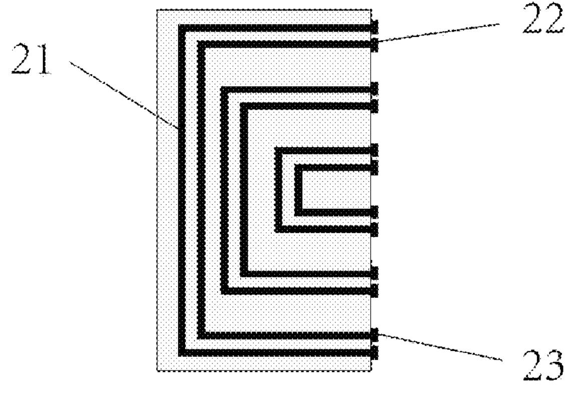
FIG. 5 is a schematic connection diagram of a daughter board trace, a first pad, and a second pad according to Embodiment 2 of this application.
Figure 6:
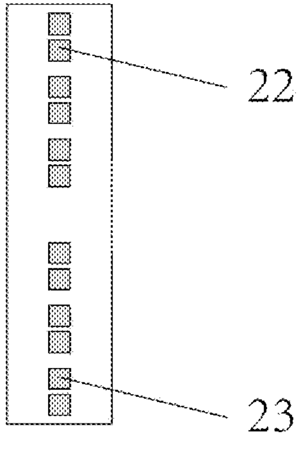
FIG. 6 is a schematic structural diagram of a daughter board according to Embodiment 2 of this application.

Referring to FIG. 5 and FIG. 6, in this embodiment, the daughter board trace 21 assumes a U-shaped structure, and a first pad 22 and a second pad 23 are provided and connected to two ends of the daughter board trace respectively. The first pad 22 and the second pad 23 are located on a surface of the daughter board 2. The first vertical trace 43 is connected to the daughter board trace 21 by the first pad 22. The second vertical trace 44 is connected to the daughter board trace 21 by the second pad 23. In this embodiment, the daughter board trace 21 is a U-shaped trace, thereby increasing the routing length of the vertical traces in a longitudinal space formed by the daughter board 2 and the build-up board 3.

To ensure that the interconnection traces 4 do not interfere with each other, in this embodiment, a plurality of interconnection traces 4 are nested in layers based on the number of layers of the build-up structure, thereby meeting the requirement of arranging a plurality of traces.

It is noted that each layer of the build-up structure may include a plurality of interconnection traces 4, thereby increasing the routing density. In some embodiments, the interconnection traces are designed as differential pairs. To be specific, two traces—one first horizontal trace 41 and one second horizontal trace 42—are arranged in parallel within the same layer of build-up structure.

In this embodiment, the build-up structure includes prepreg and copper foil stacked sequentially. The build-up board 3 may be formed by repeatedly laminating the prepreg and the copper foil together.

In some embodiments, the space between the daughter board 2 and the main board 1 is filled with a dielectric layer 5. An upper surface of the dielectric layer 5 is flush with an upper surface of the main board 1. The dielectric layer 5 is made of a resin material, specifically, epoxy resin or polyimide resin.

Embodiment 3

This embodiment provides a method for fabricating the circuit board described in Embodiment 1. The method includes the following steps:

Step 1: Form a blind cavity 11 on a main board 1.

In an optional implementation, the blind cavity 11 is formed on a first surface of the main board 1 by mechanical or laser means.

Step 2: Dispose, in the blind cavity 11, a daughter board 2 containing a daughter board trace 21.

Step 3: Perform a plurality of build-up processes on a surface of the main board 1 to form a build-up board 3; perform stacked-via drilling and electroplating on the build-up structure after each build-up process to form a first vertical trace 43 and a second vertical trace 44; and create traces for the build-up structure after each build-up process to form a first trace, a second trace, a first horizontal trace 41, and a second horizontal trace 42, where the first trace, the first horizontal trace 41, and the first vertical trace 43 are connected sequentially, and the second trace, the second horizontal trace 42, and the second vertical trace 44 are connected sequentially.

Embodiment 4

This embodiment provides a method for fabricating the circuit board described in Embodiment 2. The method includes the following steps:

Step 1: Fabricate a main board 1 and a daughter board 2 based on design data.

During the fabrication of the main board 1 and the daughter board 2, the boards are fabricated based on the locations of the components to be interconnected. During the fabrication of the daughter board 2, a daughter board trace 21 is formed based on the number and positions of the connection points (such as solder balls and leads) of the components to be interconnected.

Step 2: Dispose a first pad 22 and a second pad 23 on the daughter board 2.

In an optional implementation, after the patterned trace of the daughter board 2 is formed, electroplating is performed on the surface of the daughter board 2. After completion of the electroplating, the first pad 22 and the second pad 23 are milled out by a pin-milling process.

Step 3: Form a blind cavity 11 on the main board 1.

Step 4: Dispose, in the blind cavity 11, a daughter board 2 containing a daughter board trace 21.

In an optional implementation, the daughter board 2 is adhesively embedded into the blind cavity 11 by means of an insulating medium, so that the upper surface of the daughter board 2 is flush with the upper surface of the main board 1. The insulating medium covers the surface of the daughter board 2 to form a dielectric layer 5. Specifically, the bottom of the blind cavity 11 is filled with a layer of insulating medium. The daughter board 2 is placed in the blind cavity 11. A clearance between the blind cavity 11 and the daughter board 2, and the top side of the insulating medium, are filled with insulating medium until the insulating medium is flush with the upper surface of the main board 1.

Step 5: Perform a plurality of build-up processes on a surface of the main board 1 to form a build-up board 3; perform stacked-via drilling and electroplating on the build-up structure after each build-up process to form a first vertical trace 43 and a second vertical trace 44; and create traces for the build-up structure after each build-up process to form a first trace, a second trace, a first horizontal trace 41, a second horizontal trace 42, a third trace, and a fourth trace.

In step 5, a plurality of interconnection lines 4 are nested in layers based on the number of layers of the build-up structure, and the nesting includes:

laser-drilling current-layer vias and stacked vias in the build-up structure resulting from the first build-up process and in the dielectric layer 5; laser-drilling, on an outermost layer of the build-up structure after each subsequent build-up process, current-layer vias and stacked vias that are stacked with the stacked vias on an adjacent layer of the build-up structure, where the current-layer vias are at least one pair of vias located at an outermost side in a cavity width direction of the blind cavity 11 among the laser-drilled vias on each layer;

electroplating and filling the current-layer vias and the stacked vias in the outermost layer of the build-up structure after each build-up process, such that the current-layer vias and the stacked vias stacked with the current-layer vias form a first vertical trace 43 and a second vertical trace 44 after being electroplated; and fabricating a first trace, a second trace, a first horizontal trace 41, a second horizontal trace 42, a third trace, and a fourth trace in the outermost layer of the build-up structure after each build-up process. The first trace, the first horizontal trace 41, the first vertical trace 43, the daughter board trace 21, the second vertical trace 44, the second horizontal trace 42, and the second trace are connected sequentially.

Embodiment 5

This embodiment describes an example in which three build-up processes are performed on the surface of the main board 1. Step 5 in Embodiment 4 are described in detail here.

In this embodiment, the three build-up processes involve a first build-up structure, a second build-up structure, and a third build-up structure that are laminated sequentially.

After the first build-up structure is laminated onto the main board 1, a first current-layer via of the first build-up structure and a first stacked via for stacked drilling with the second build-up structure are simultaneously laser-drilled. The first current-layer via and the first stacked via are filled by electroplating to obtain a first vertical trace 43 and a second vertical trace 44 in an interconnection trace 4. Traces are created on the first build-up structure to obtain a first horizontal trace 41 and a second horizontal trace 42 of the interconnection trace 4, as well as traces for forming the first trace, the second trace, the third trace, and the fourth trace.

After the second build-up structure is laminated onto the main board 1, a second current-layer via stacked with the first stacked via, and a second stacked via, are simultaneously laser-drilled. The second current-layer via and the second stacked via are filled by electroplating. After the second current-layer via and the first stacked via stacked with the second current-layer via are filled by electroplating to form a first vertical trace 43 and a second vertical trace 44 in another interconnection trace 4. Traces are created on the second build-up structure to obtain a first horizontal trace 41 and a second horizontal trace 42 of the interconnection trace 4, as well as traces for forming the first trace, the second trace, the third trace, and the fourth trace.

After the third build-up structure is laminated onto the main board 1, a third current-layer via stacked with the second stacked via is laser-drilled. The third current-layer via is filled by electroplating. After being electroplated, the third current-layer via and the second stacked via and the first stacked via that are stacked with the third current-layer via form a first vertical trace 43 and a second vertical trace 44 in another interconnection trace 4. Traces are created in the third build-up structure to obtain a first horizontal trace 41 and a second horizontal trace 42 of the interconnection trace 4, as well as traces for forming the first trace, the second trace, the third trace, and the fourth trace.

Embodiment 6

This embodiment provides an electronic device, including the circuit board disclosed in Embodiment 1 or Embodiment 2, or a circuit board fabricated using the method disclosed in any one of Embodiments 3 to 5.

The foregoing descriptions are merely preferred embodiments of this application. It is noted that various improvements and variations, which may be made by a person of ordinary skill in the art without departing from the technical principles of this application, still fall within the protection scope of this application.

What is claimed is:

1. A circuit board, comprising:

a main board, wherein the main board is provided with a blind cavity;

a daughter board, wherein the daughter board is disposed in the blind cavity, and a daughter board trace is provided in the daughter board; and a build-up board, wherein the build-up board is disposed on surfaces of the main board and the daughter board; the build-up board comprises a build-up structure containing a plurality of layers; the build-up board is provided with a first chip region, a second chip region, and an interconnection region located between the first chip region and the second chip region; and the interconnection region covers a surface of the daughter board; and a plurality of interconnection traces are provided in the interconnection region; each interconnection trace comprises: a first horizontal trace and a second horizontal trace disposed on a same layer of the build-up structure, a first vertical trace disposed in the build-up board and configured to connect the first horizontal trace and the daughter board trace, and a second vertical trace disposed in the build-up board and configured to connect the second horizontal trace and the daughter board trace; a first trace configured to connect the first horizontal trace and a first chip is provided in the first chip region, and a second trace configured to connect the second horizontal trace and a second chip is provided in the second chip region.

2. The circuit board according to claim 1, wherein the daughter board trace is a U-shaped structure, the daughter board trace is connected to the first vertical trace by a first pad, and is connected to the second vertical trace by a second pad; and the first pad and the second pad are located on a surface of the daughter board on a side close to the build-up board.

3. The circuit board according to claim 2, wherein the first chip is located on a surface of the first chip region, and the second chip is located on a surface of the second chip region.

4. The circuit board according to claim 2, wherein the first chip region is provided with a third trace configured to connect the first chip and the main board, and the second chip region is provided with a fourth trace configured to connect the second chip and the main board.

5. The circuit board according to claim 1, wherein the build-up structure comprises prepreg and copper foil stacked sequentially.

6. The circuit board according to claim 1, wherein a space between the daughter board and the main board is filled with a dielectric layer.

7. The circuit board according to claim 6, wherein the dielectric layer is a resin material layer.

8. The circuit board according to claim 1, wherein a plurality of interconnection traces are nested in layers across a plurality of layers of the build-up structure.

9. A method for fabricating the circuit board according to claim 1, comprising:

forming the blind cavity on the main board;

disposing, in the blind cavity, the daughter board containing the daughter board trace; and performing a plurality of build-up processes on a surface of the main board to form the build-up board; performing stacked-via drilling and electroplating on the build-up structure after each build-up process to form a first vertical trace and a second vertical trace; and creating traces for the build-up structure after each build-up process to form a first trace, a second trace, a first horizontal trace, and a second horizontal trace, wherein the first trace, the first horizontal trace, the first vertical trace, the daughter board trace, the second vertical trace, the second horizontal trace, and the second trace are connected sequentially.

10. The method for fabricating the circuit board according to claim 9, wherein the daughter board trace is a U-shaped structure, the daughter board trace is connected to the first vertical trace by a first pad, and is connected to the second vertical trace by a second pad; and the first pad and the second pad are located on a surface of the daughter board on a side close to the build-up board.

11. The method for fabricating the circuit board according to claim 10, wherein the first chip is located on a surface of the first chip region, and the second chip is located on a surface of the second chip region.

12. The method for fabricating the circuit board according to claim 10, wherein the first chip region is provided with a third trace configured to connect the first chip and the main board, and the second chip region is provided with a fourth trace configured to connect the second chip and the main board.

13. The method for fabricating the circuit board according to claim 9, wherein the build-up structure comprises prepreg and copper foil stacked sequentially.

14. The method for fabricating the circuit board according to claim 9, wherein a space between the daughter board and the main board is filled with a dielectric layer.

15. The method for fabricating the circuit board according to claim 14, wherein the dielectric layer is a resin material layer.

16. The method for fabricating the circuit board according to claim 1, wherein a plurality of interconnection traces are nested in layers across a plurality of layers of the build-up structure.

17. An electronic device, wherein the electronic device comprises the circuit board according to claim 1.

18. The electronic device according to claim 17, wherein the daughter board trace is a U-shaped structure, the daughter board trace is connected to the first vertical trace by a first pad, and is connected to the second vertical trace by a second pad; and the first pad and the second pad are located on a surface of the daughter board on a side close to the build-up board.

19. The electronic device according to claim 18, wherein the first chip is located on a surface of the first chip region, and the second chip is located on a surface of the second chip region.

20. The electronic device according to claim 18, wherein the first chip region is provided with a third trace configured to connect the first chip and the main board, and the second chip region is provided with a fourth trace configured to connect the second chip and the main board.

21. The electronic device according to claim 17, wherein the build-up structure comprises prepreg and copper foil stacked sequentially.

22. The electronic device according to claim 17, wherein a space between the daughter board and the main board is filled with a dielectric layer.

23. The electronic device according to claim 17, wherein a plurality of interconnection traces are nested in layers across a plurality of layers of the build-up structure.

24. An electronic device, wherein the electronic device comprises a circuit board fabricated using the method according to claim 9.

25. The electronic device according to claim 24, wherein the daughter board trace is a U-shaped structure, the daughter board trace is connected to the first vertical trace by a first pad, and is connected to the second vertical trace by a second pad; and the first pad and the second pad are located on a surface of the daughter board on a side close to the build-up board.

26. The electronic device according to claim 25, wherein the first chip is located on a surface of the first chip region, and the second chip is located on a surface of the second chip region.

27. The electronic device according to claim 25, wherein the first chip region is provided with a third trace configured to connect the first chip and the main board, and the second chip region is provided with a fourth trace configured to connect the second chip and the main board.

28. The electronic device according to claim 24, wherein the build-up structure comprises prepreg and copper foil stacked sequentially.

29. The electronic device according to claim 24, wherein a space between the daughter board and the main board is filled with a dielectric layer.

30. The electronic device according to claim 24, wherein a plurality of interconnection traces are nested in layers across a plurality of layers of the build-up structure.

* * * * *